US006771719B1

United States Patent
Koyama et al.

(10) Patent No.: US 6,771,719 B1
(45) Date of Patent: Aug. 3, 2004

(54) AUTOMATIC GAIN CONTROL METHOD AND ITS SYSTEM

(75) Inventors: Takeshi Koyama, Kanagawa-ken (JP); Takashi Seki, Kanagawa-ken (JP); Noboru Taga, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/510,236

(22) Filed: Feb. 22, 2000

(30) Foreign Application Priority Data

Feb. 22, 1999 (JP) ............................................ 11-043223
Oct. 5, 1999 (JP) ............................................ 11-284190

(51) Int. Cl.[7] .............................................. H04L 27/08
(52) U.S. Cl. ................. 375/345; 455/234.1; 455/240.1; 455/241.1
(58) Field of Search ................................. 375/316–317, 375/345, 346; 455/226.1, 226.2, 226.3, 226.4, 232.1, 234.1, 234.2, 240.1, 241.1, 242.2, 245.1, 249.1, 250.1, 251.1, 247.1, 67.3

(56) References Cited

U.S. PATENT DOCUMENTS

| 5,678,169 | A | * | 10/1997 | Turney ............................ 455/1 |
| 5,732,342 | A | * | 3/1998 | Roth et al. ................ 455/234.1 |
| 5,745,847 | A | * | 4/1998 | Matsuo ..................... 455/234.1 |
| 6,044,253 | A | * | 3/2000 | Tsumura ................... 455/234.1 |
| 6,148,189 | A | * | 11/2000 | Aschwanden ............ 455/234.1 |
| 6,324,387 | B1 | * | 11/2001 | Kamgar et al. ........... 455/234.1 |

FOREIGN PATENT DOCUMENTS

| EP | 0714174 | 5/1996 |
| GB | 2271231 | 4/1994 |
| GB | 2317283 | 3/1998 |
| JP | 8-330985 | 12/1996 |
| JP | 9-93509 | 4/1997 |
| JP | 10-65750 | 3/1998 |

* cited by examiner

Primary Examiner—Tesfaldet Bocure
Assistant Examiner—Khanh Cong Tran
(74) Attorney, Agent, or Firm—Pillsbury Winthrop LLP

(57) ABSTRACT

The automatic gain control method with little being influenced of the unnecessary electric wave, even if strong unnecessary electric wave is near the frequency of input signal, is offered by carrying out change of the delay point level.

The automatic gain control system with a scale of few circuit, having low noise property and high adjacent disturbance oppression property, is offered.

When the IF AGC signal 112 is smaller than delay point level, the output agcerr of the signal level detector 614 is provided to the 1st loop filter 105.

Since the IF AGC signal 112 provided to the IF AGC amplifier 608 is value responding to signal level of IF signal, output is fed back to this amplifier, and control of IF gain is performed automatically.

On the other hand, when output of the 2nd loop filter 106 is "0", output rfzero of the 2nd comparator 108 is set to 1, and "0" is provided to the 2nd loop filter 106.

When the output of the 2nd loop filter 106 is not "0", it is set to "0", fixed value-rfdump is provided to the 2nd loop filter 106, and the output of the 2nd comparator 108 is converged when output of this loop filter became "0."

For this reason, the RFAGC signal 113 provided to the RF AGC amplifier 602 is set to "0", and gain of the RF AGC amplifier 602 is fixed to maximum value.

6 Claims, 13 Drawing Sheets

| ifltdp | ifeqdp | agsign | rfzero | INPUT OF LOOP FILTER 105 | INPUT OF LOOP FILTER 106 |
|---|---|---|---|---|---|
| 1 | 0 | 0 | 0 | agcerr | -rfdump |
| 1 | 0 | 0 | 1 | agcerr | 0 |
| 1 | 0 | 1 | 0 | agcerr | -rfdump |
| 1 | 0 | 1 | 1 | agcerr | 0 |
| 0 | 1 | 0 | 0 | 0 | agcerr |
| 0 | 1 | 0 | 1 | 0 | agcerr |
| 0 | 1 | 1 | 0 | 0 | agcerr |
| 0 | 1 | 1 | 1 | agcerr | 0 |
| 0 | 0 | 0 | 0 | -ifdump | agcerr |
| 0 | 0 | 0 | 1 | -ifdump | agcerr |
| 0 | 0 | 1 | 0 | -ifdump | agcerr |
| 0 | 0 | 1 | 1 | agcerr | 0 |

Fig. 2

| ifltdp | ifeqdp | agsign | rfzero | COUNTER 405 | COUNTER 406 |
|---|---|---|---|---|---|
| 1 | 0 | 0 | 0 | up | down |
| 1 | 0 | 0 | 1 | up | 0 |
| 1 | 0 | 1 | 0 | down | down |
| 1 | 0 | 1 | 1 | down | 0 |
| 0 | 1 | 0 | 0 | dplevel | up |
| 0 | 1 | 0 | 1 | dplevel | up |
| 0 | 1 | 1 | 0 | dplevel | down |
| 0 | 1 | 1 | 1 | down | 0 |
| 0 | 0 | 0 | 0 | down | up |
| 0 | 0 | 0 | 1 | down | up |
| 0 | 0 | 1 | 0 | down | down |
| 0 | 0 | 1 | 1 | down | 0 |

Fig. 5

| ifltdp | ifeqdp | agsign | rfzero | cont1 | cont2 |
|---|---|---|---|---|---|
| 1 | 0 | 0 | 0 | agcerr | -rfdump |
| 1 | 0 | 0 | 1 | agcerr | 0 |
| 1 | 0 | 1 | 0 | agcerr | -rfdump |
| 1 | 0 | 1 | 1 | agcerr | 0 |
| 0 | 1 | 0 | 0 | 0 | agcerr |
| 0 | 1 | 0 | 1 | 0 | agcerr |
| 0 | 1 | 1 | 0 | 0 | agcerr |
| 0 | 1 | 1 | 1 | agcerr | 0 |
| 0 | 0 | 0 | 0 | -ifdump | agcerr |
| 0 | 0 | 0 | 1 | -ifdump | agcerr |
| 0 | 0 | 1 | 0 | -ifdump | agcerr |
| 0 | 0 | 1 | 1 | agcerr | 0 |

Fig. 8

AUTOMATIC GAIN CONTROL METHOD AND ITS SYSTEM

BACKGROUND (1) Field of the Invention

The present invention relates to automatic gain control systems which automatically control the gain of digital modulating signal, more particularly to dual AGC control system which has double gain control loop of RF AGC and IF AGC.

(2) Description of the Related Art

As digital modulation techniques used in order that signal level may generally transmit digital signal data (namely, symbol) expressed with binary methods, digital modulation method such as Phase shift Keying (PSK), Quadrature Amplitude Modulation (QAM), and Orthogonal Frequency Division Multiplexing (OFDM), are known.

In modulating equipment which adopted these digital modulation techniques, orthogonal modulation by analog carrier is performed using two symbol of I and Q which are sampled and quantized at predetermined time interval.

Further, thus the modulated signal is converted to radio frequency (RF), such as VHF band and UHF band, and is sent out to them.

In digital demodulating equipment, after tuning in signal of desire wave and carrying out frequency conversion to Intermediate Frequency (IF), carrier component is eliminated, compare is carried out to predetermined symbol level, and the nearest symbol level is judged a playback symbol value.

Since signal level of received signal is fluctuated according to field streng that the time, signal level of recovery signal is always fixed using Automatic Gain Control (AGC).

Hereafter, conventional automatic gain control system is explained with reference to FIG. 13. FIG. 13 shows a block diagram of conventional automatic gain control system.

After amplifying RF signal provided from the terminal 601 in the RF AGC amplifier 602, it is provided to the 1st frequency converter 604.

The 1st frequency converter 604 transforms output of the RF AGC amplifier 602 into predetermined 1st intermediate frequency based on frequency control signal provided to the terminal 603.

After carrying out band limitation of the output of the 1st frequency converter 604 by the 1st filter 605, it is provided to the 2nd frequency converter 606.

The 2nd frequency converter 606 transforms output of the 1st filter 605 into predetermined 2nd intermediate frequency based on frequency control signal provided to the terminal 603. After carrying out band limitation of the output of the 2nd frequency converter 606 by the 2nd filter 607, it is provided to the IF AGC amplifier 608. The IF signal 609 amplified by the IF AGC amplifier 608 is provided to the orthogonal wave detector 610 and the signal level detector 614.

The orthogonal wave detector 610 provides I and Q component signal which eliminated the carrier component to the demodulator 611. The demodulator 611 recovers the transmitted digital signal data from two component signals, I and Q, and provides it to the error corrector 612.

The error corrector 612 corrects the error in digital signal data, and provides it to the output terminal 613.

After detecting signal level of IF signal 609 provided from the IF AGC amplifier 608, the signal level detector 614 provides the error between the signal level and predetermined level, i.e., signal level error signal agcerr, to the loop filter 615. The loop filter 615 integrates signal level error signal agcerr, and provides the AGC signal 616 which eliminated the noise component to the comparator 617.

The comparator 617 compares the AGC signal 616 with predetermined level, i.e., the delay point level. When the AGC signal 616 is smaller than delay point level, the control signal is provided to the IF AGC amplifier 608. When the AGC signal 616 is larger than delay point level, the control signal is provided to the RF AGC amplifier 602.

The operation of the conventional automatic gain control system shown in FIG. 13 is explained.

The RF AGC amplifier 602 and the IF AGC amplifier 608 have the gain property that the gain becomes small, when the control signal provided from the comparator 617 becomes large, respectively. Moreover, the signal level detector 614 has the characteristics that the output becomes large, when the signal level of IF signal 609 becomes larger than predetermined signal level.

For this reason, since the output of the signal level detector 614 becomes small when the signal level of IF signal 609 is small, it is controlled so that the gain of the IFAGC amplifier 608 or the RF AGC amplifier 602 becomes large and the signal level of IF signal 609 becomes large.

Moreover, since the output of the signal level detector 614 becomes large when the level of the input signal is large, it is controlled so that the gain of the IF AGC amplifier 608 or the RF AGC amplifier 602 becomes small and the signal level of IF signal 609 becomes small.

Thus, the signal level of IF signal 609 is controlled to desired level by changing the gain of the IF AGC amplifier 608 or the RF AGC amplifier 602. This control is called automatic gain control.

It is decided on delay point level using which of the IF AGC amplifier 608 and the RF AGC amplifier 602 the automatic gain control is carried out.

When the AGC signal 616 is smaller than delay point level, the gain of the RF AGC amplifier 602 is fixed and the automatic gain control is performed by changing the gain of the IF AGC amplifier 608.

When the automatic gain control signal is larger than delay point level, the gain of the IF AGC amplifier 608 is fixed and the automatic gain control is performed by changing the gain of the RF AGC amplifier 602.

Thus, changing IF AGC and RF AGC according to the signal level of the input signal is performed in order to take the large control range of AGC, maintaining low noise characteristics. Namely, on the premise that the total gain of the IF AGC amplifier 608 and the RF AGC amplifier 602 is fixed, in the case of low gain of the RF AGC amplifier 602 and high gain of the IF AGC amplifier 608, the noise factor (NF) becomes higher than the reverse case.

For this reason, when signal level is low, it is more advantageous to fix RF AGC on the maximum gain in respect of noise characteristics.

On the other hand, if the automatic gain control is applied only by the IF AGC amplifier 608, since the control range of AGC is limited by the dynamic range of the IF AGC amplifier 608, the range becomes narrow. Then, when signal level is high, the automatic gain control range can be made wide by applying AGC using the RF AGC amplifier 602.

As explained above, the conventional automatic gain control system has the characteristics of having the wide control range by the low noise.

However, the conventional automatic gain control apparatus causes the following faults, when the high disturbance wave of signal level is in the adjacent channel.

Since there is no filter which limits the band of the signal before RF AGC, with the RF AGC amplifier 602, the signal of the adjacent channel is also amplified with the signal of the desire wave. On the one hand, with the latter filter, band limitation of the automatic gain control signal is carried out, and it is generated according to the level of the signal of the desire wave.

For this reason, if the disturbance wave of high signal level is in the adjacent channel, the gain of the RF AGC amplifier 602 is too high, and may become the saturation state. The saturation state of the RF AGC amplifier 602 causes the distortion of the signal, and produces the remarkable degradation for the performance of the demodulator. Since the RF AGC amplifier 602 is saturated when the worst, the demodulation of the signal may not be made.

Thus, in the conventional automatic gain control system, when the adjacent disturbance wave of high signal level existed, there was a problem that the performance of the demodulator degraded remarkably.

SUMMARY

The inventions provide in part an automatic gain control method and its system which are the few circuit scale, and have low noise characteristics and high adjacent disturbance oppression characteristics, and do not have the need for the tuning.

A claimed method comprises: amplifying a radio frequency signal received; converting the radio frequency signal amplified into an intermediate signal; amplifying the intermediate signal; outputting an error signal which is deference between a level of the intermediate signal amplified and a predetermined level; controlling a gain of amplification of the intermediate signal according to the error signal outputted; controlling a gain of amplification of the radio frequency signal according to the error signal outputted; and, changing a delay point level, the delay point level being a boundary value of whether the gain of the intermediate frequency signal amplification is controlled, or the gain of the radio frequency signal amplification is controlled.

According to the present invention, even if it can change the delay point level which performs the switching of the IF amplification gain control and the RF amplification gain control and only the desired signal is receivable with sufficient selectivity when there is an unnecessary strong electric wave near received wave frequency.

Moreover, in other invention, the change of the delay point level is automatically carried out so that the error rate may become small by the error rate detection step.

According to this invention, even if there is an unnecessary electric wave strong against the frequency near the received frequency, only the desired signal is receivable with sufficient selectivity, quickly and automatically.

BRIEF DESCRIPTION OF THE DRAWINGS

FIG. 2 is a state diagram for the operation of the 1st embodiment of the automatic gain control system shown in FIG. 1.

FIG. 5 is a state diagram for the operation of the 3rd embodiment of the automatic gain control system shown in FIG. 4.

FIG. 8 is a state diagram for the operation of the selector 801 of the automatic gain control system shown in FIG. 7.

DETAILED DESCRIPTION

The present invention has the characteristic feature in altering and establishing the delay point level dplevel so that the demodulation may be in the best status.

Figure 11:
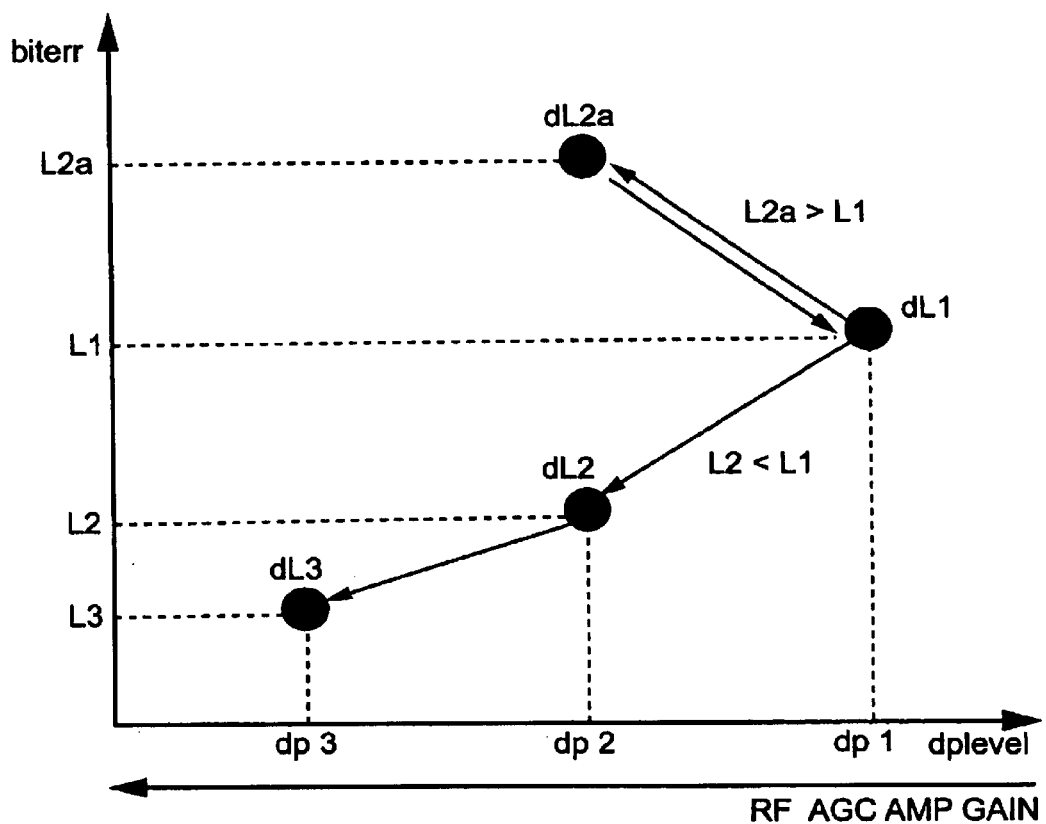
FIG. 11 is a state diagram showing the change of the gain status of the automatic gain control system by the invention.

Before explaining the concrete embodiments of the invention, how to alter and establish the delay point level dplevel is briefly explained using FIGS. 11 and 12.

The status of the demodulation is evaluated by whether bit error signal biterr is large. When bit error signal biterr is large, it implies that the demodulation is in the bad status.

Therefore, delay point level dplevel is altered and it is investigated whether bit error signal biterr became large, and delay point level dplevel is established manually or automatically so that bit error signal biterr may become the smallest.

FIG. 11 is a recovery state diagram showing the relation between delay point level dplevel and bit error signal biterr. In FIG. 11, delay point level dplevel was taken along the horizontal axis, and it took bit error signal biterr on the vertical axis.

Generally, when delay point level dplevel becomes small, the gain of RF AGC amplifier becomes large, if the gain of IF AGC amplifier is fixed. The horizontal axis shows this relation.

Bit error signal biterr of the vertical axis shows the recovery status of the signal, and the small bit error signal implies that the recovery status is good.

When delay point level dplevel is set as dp1, it is assumed that bit error signal biterr was set to L1. The recovery status will be in the point dL1 at the time. Next, delay point level dplevel is lowered and it is made the point dp2. It is assumed that bit error signal biterr became large and was set to L2a at this time. It means that the recovery status has transferred to the point dLa2 at the time.

In this case, bit error signal biterr returns to the point dL1, in which bit err signal biterr is small, by setting delay point level dplevel as dp1 again.

It assumes that, when delay point level dplevel is lowered and it is made dp2, bit error signal biterr has become L2 which is smaller than L1. Then, it means that the recovery status has transferred to the point dL2.

It assumes that, when delay point level dplevel is lowered and it is made dp3, bit error signal biterr has become L3 which is smaller than L2. It means that the recovery status has transferred to the point dL3 at the time.

Thus, when bit error signal biterr becomes small, namely, the recovery status becomes good by changing the delay point level dplevel, the control direction is not changed.

Also, when bit error signal biterr becomes large, namely, the recovery status becomes bad by changing the delay point level dplevel, the control direction is not changed.

FIG. 12 explains the relation between delay point level dplevel and the recovery status, in case where there is no disturbance wave and in case where there is a disturbance wave. In FIG. 12 as well as FIG. 11, delay point level dplevel is taken along the horizontal axis, and bit error signal biterr is taken on the vertical axis.

Figure 12A:
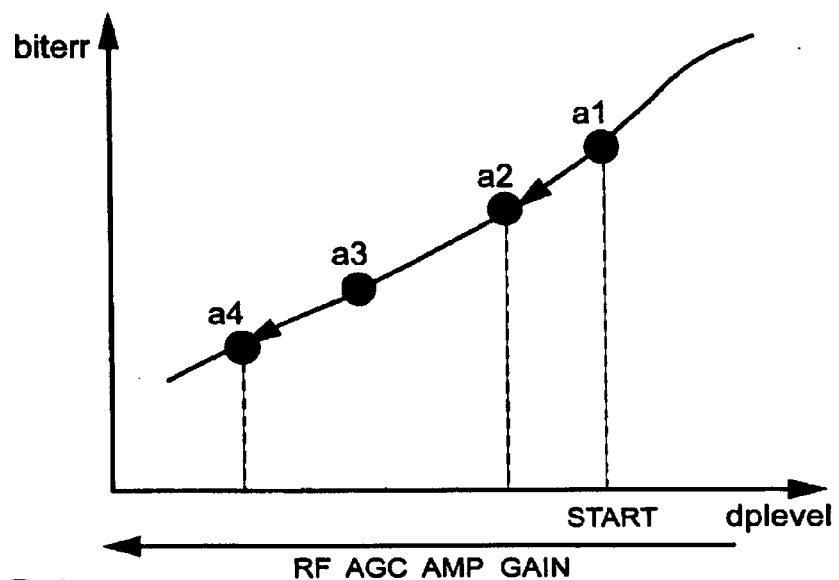
FIG. 12 is a state diagram showing the change of the recovery status of the automatic gain control apparatus by the invention.
Figure 12B:
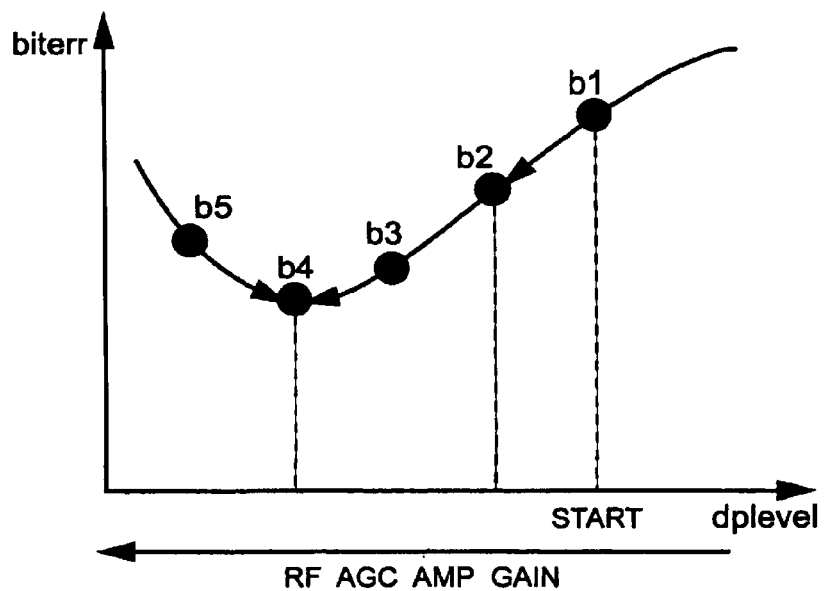

Supposing the gain of IF AGC amplifier is fixed, the curved line showing the relation between delay point level dplevel and bit error signal biterr is shown in FIG. 12A, in case of no disturbance wave. When there is a disturbance wave, the curved line is shown in FIG. 12B.

The usual case where there is no disturbance wave is explained. If delay point level dplevel is increased first and bit error signal biterr at that time is measured, it will transfer to the point a1 in FIG. 12A from those relations.

Next, if delay point level dplevel lowers by only fixed level and bit error signal biterr at that time is measured, it will be in the status which bit error signal biterr falls rather than before, and the status transfers to the point a2. This implies that the recovery status became good rather than before.

Next, again, similarly, if delay point level dplevel lowers by only predetermined value and bit error signal biterr is measured, bit error signal biterr falls again and the status transfers to the point a3. Similarly, next, the status transferred to the point a4.

Therefore, the line showing the relation between delay point level dplevel and bit error signal biterr turns into the curved line of left going down.

Thus, when delay point level dplevel is made small, bit error signal biterr becomes small, as shown in FIG. 12A, in case of no disturbance wave. The gain of the RF AGC amplifier 602 becomes the max and the bit error signal biterr becomes the minimum. In other words, the recovery status becomes good when increasing the gain of RF AGC amplifier.

However, when the disturbance wave is near the received wave, the situation differs.

If delay point level dplevel is made small, as shown in FIG. 12B, it is in the point b1 at first, and, next, transfers to the point b2, the point b3, and the point b4, namely, bit error signal biterr becomes smaller than before.

However, on the way, as shown in the point b5, the value of bit error signal biterr will become large under the affection of the disturbance wave.

It implies that this has the optimum value of delay point level dplevel with the most sufficient recovery status of the input signal on the way when there is a disturbance wave.

In other words, it implies that what is necessary is just to control so that RF AGC amplifier acquires the gain corresponding to the delay point level dplevel which hits the point b4, in order to improve the recovery status of the input signal most, when there is a disturbance wave.

Embodiment 1

Figure 1:
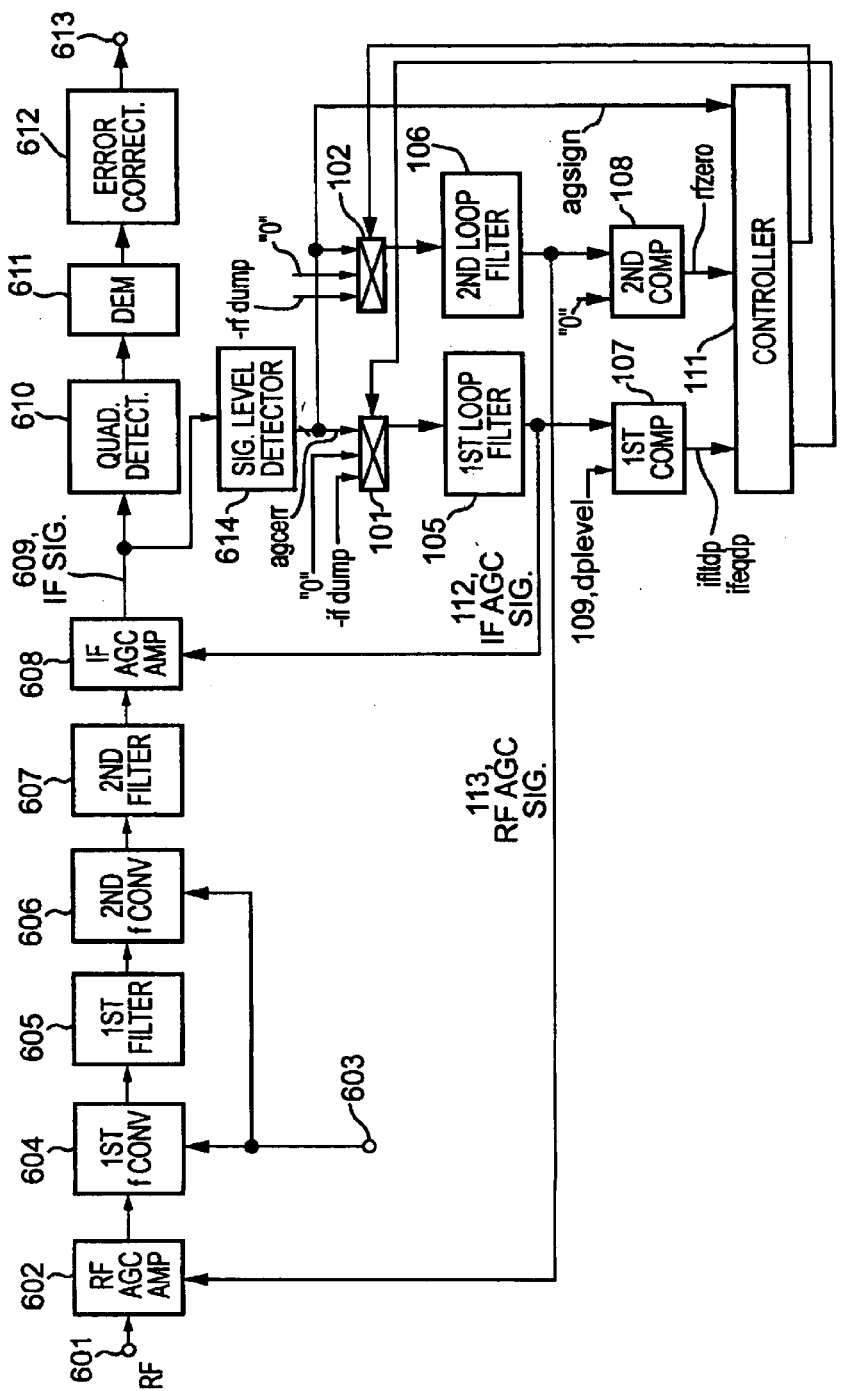
FIG. 1 is a block diagram showing the structure of the 1st embodiment of the automatic gain control system by the invention.

The structure of an automatic gain control system of the 1st embodiment by the invention is shown in FIG. 1.

Figure 13:
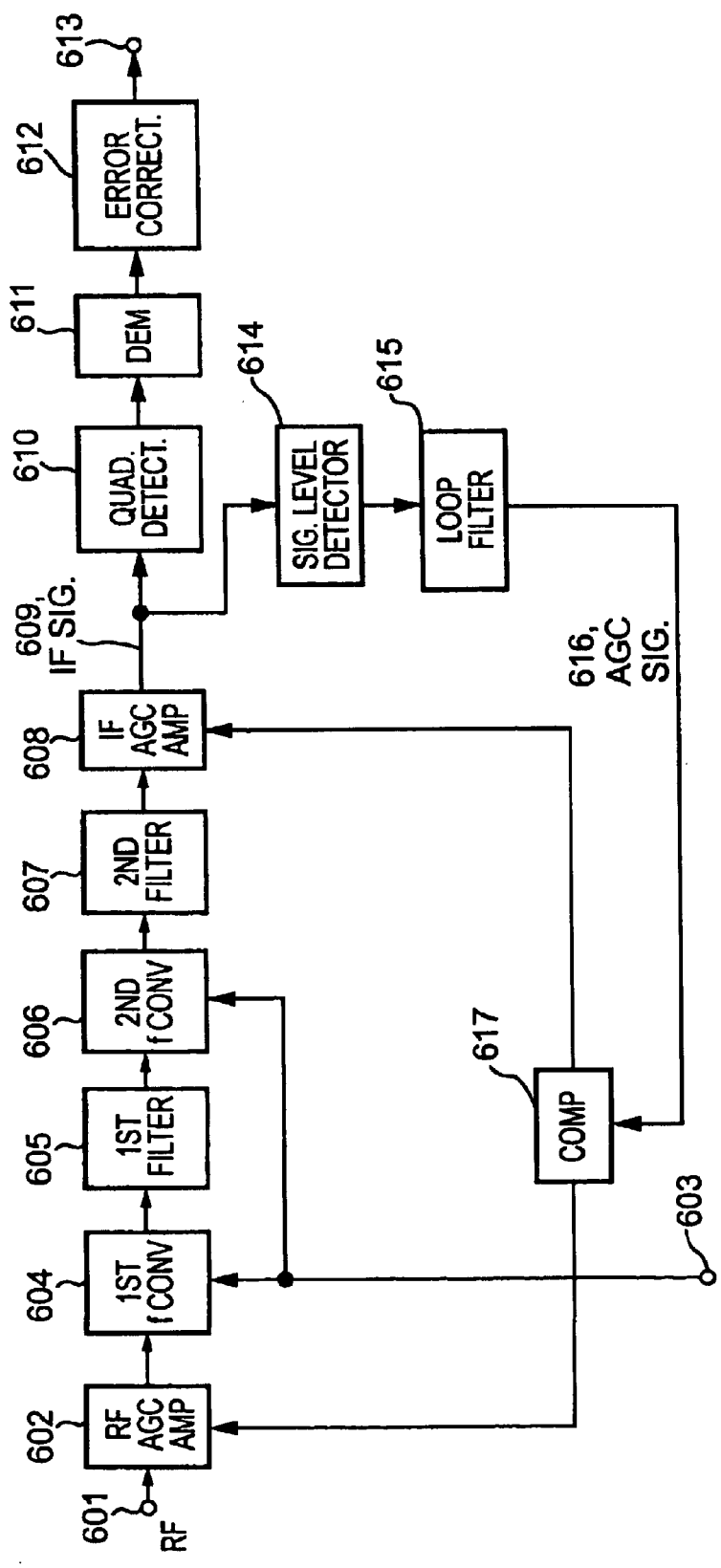
FIG. 13 is a block diagram showing the structure of a conventional automatic gain control system.

The structure shown in FIG. 1 adds the 1st selector 101, the 2nd selector 102, the 1st loop filter 105, the 2nd loop filter 106, the 1st comparator 107, the 2nd comparator 108, and the controller 111 to the conventional automatic gain control system shown in FIG. 13.

The loop filter 615 and the comparator 617 are deleted. The structure furthermore shown in FIG. 1 is altered so that the control signal of the IF AGC amplifier 608 may be provided from the 1st loop filter 105 and the control signal of the RF AGC amplifier 602 may be provided from the 2nd loop filter 106. Other structures of FIG. 1 are the same as that of the structure shown in FIG. 13. The explanation of the same component as FIG. 13 is omitted.

The output of the signal level detector 614 is provided to the 1st input terminal of the 1st selector 101, and the 1st input terminal of the 2nd selector 102.

The value "0" is inputted into the 2nd input terminal of the 1st selector 101. The value "0" is inputted into the 2nd input terminal of the 2nd selector 102.

Fixed value-ifdump is inputted into the 3rd input terminal of the 1st selector 101. Fixed value-rfdump is inputted into the 3rd input terminal of the 2nd selector 102. The output of the 1st selector 101 is provided to the 1st loop filter 105. The output of the 2nd selector 102 is provided to the 2nd loop filter 106.

As an IF AGC control signal 112, the output of the 1st loop filter 105 is provided to the IF AGC amplifier 608, and is provided also to one input terminal of the 1st comparator 107.

As a RF AGC control signal 113, the output of the 2nd loop filter 106 is provided to the RF AGC amplifier 602, and is provided also to one input terminal of the 2nd comparator 108. The value dplevel which shows delay point level is inputted into another input terminal 109 of the 1st comparator 107. The value "0" is inputted into another input terminal of the 2nd comparator 108.

The 1st comparator 107 provides the signal ifltdp, which becomes "1" when the IF AGC signal 112 is smaller than fixed value dplevel, to the 1st input terminal of the controller 111. The 1st comparator 107 provides the signal ifeqdp, which becomes "1" when the IF AGC control signal 112 is equal to fixed value dplevel, to the 1st input terminal of the controller 111.

The 2nd comparator 108 provides the signal rfzero, which becomes "1" when the RF AGC control signal 113 becomes "0", to the 2nd input terminal of the controller 111.

The signal, which becomes "1" when the sign of the output of the signal level detector 614 is negative, is provided to the 3rd input terminal of the controller 111. The signal agsign is the signal showing the sign of the signal agcerr.

The controller 111 generates each selecting signal of the 1st selector 101 and the 2nd selector 102 from the signal ifltdp, the signal ifeqdp, the signal agsign, and the signal rfzero.

By the way, the signals ifltdp, ifeqdp, agsign, and rfzero have the following semantics respectively.
Ifltdp=(ifgain<dplevel)
ifeqdp=(ifgain==dplevel)
agsign=(agcerr<0)
rfzero=(rfgain==0)

That is, the signal ifltdp becomes "1" when the gain ifgain of IF AGC amplifier is smaller than delay point level dplevel. The signal ifeqdp becomes "1" when the gain if gain of IFAGC amplifier is equal to delay point level dplevel.

The IF signal of the IF AGC amplifier 608 is compared to predetermined level in the signal level detector 614. The signal agsign is set to "1" when the IF signal is smaller than predetermined level i.e., when the output signal agcerr of the signal level detector 614 is negative.

The signal agsign is set to "0" when the signal agcerr is positive. The signal rfzero is set to "1" when the gain rfgain of RF AGC amplifier 602 is "0", and when the gain rfgain of RFAGC amplifier 602 is not equal to "0", the signal rfzero is set to "0".

Figure 9:
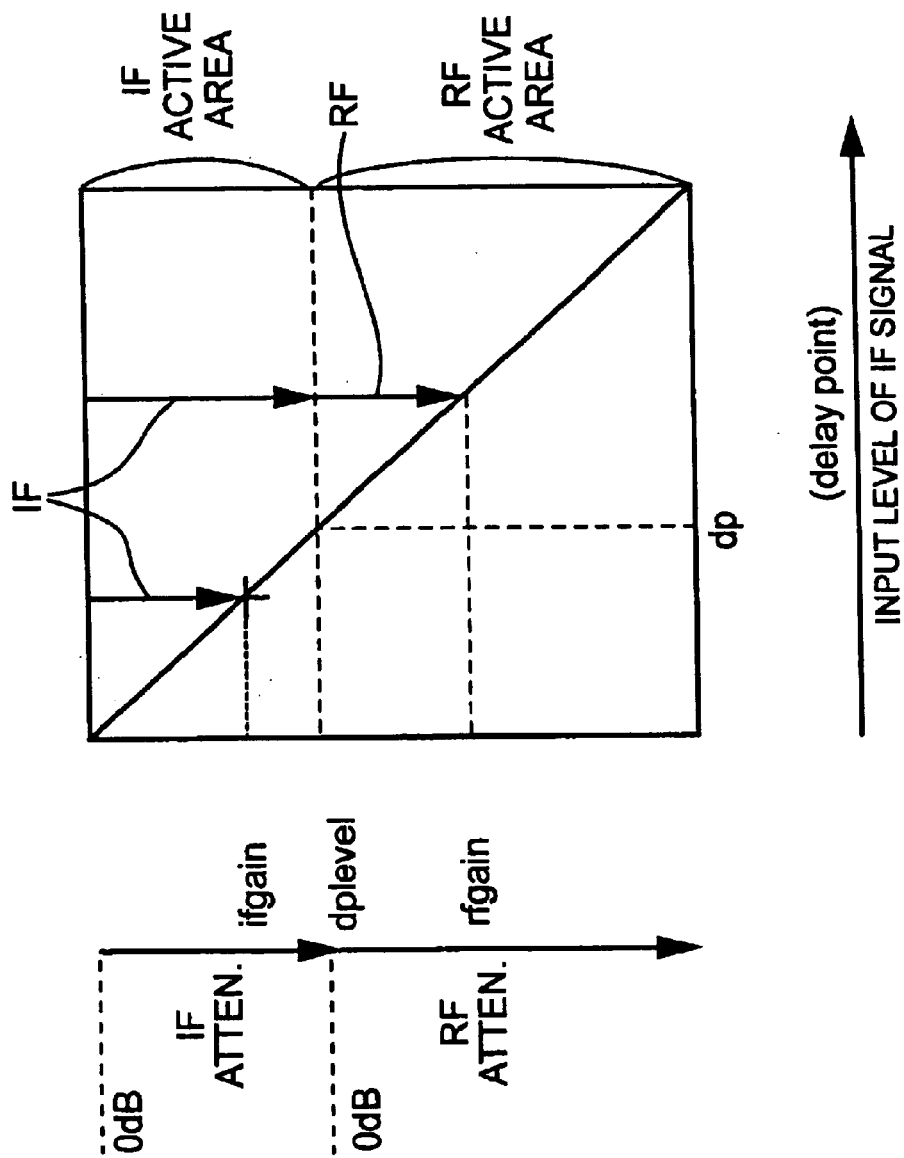
FIG. 9 is a state diagram showing the status of the gain of the automatic gain control system by the invention.
Figure 10:
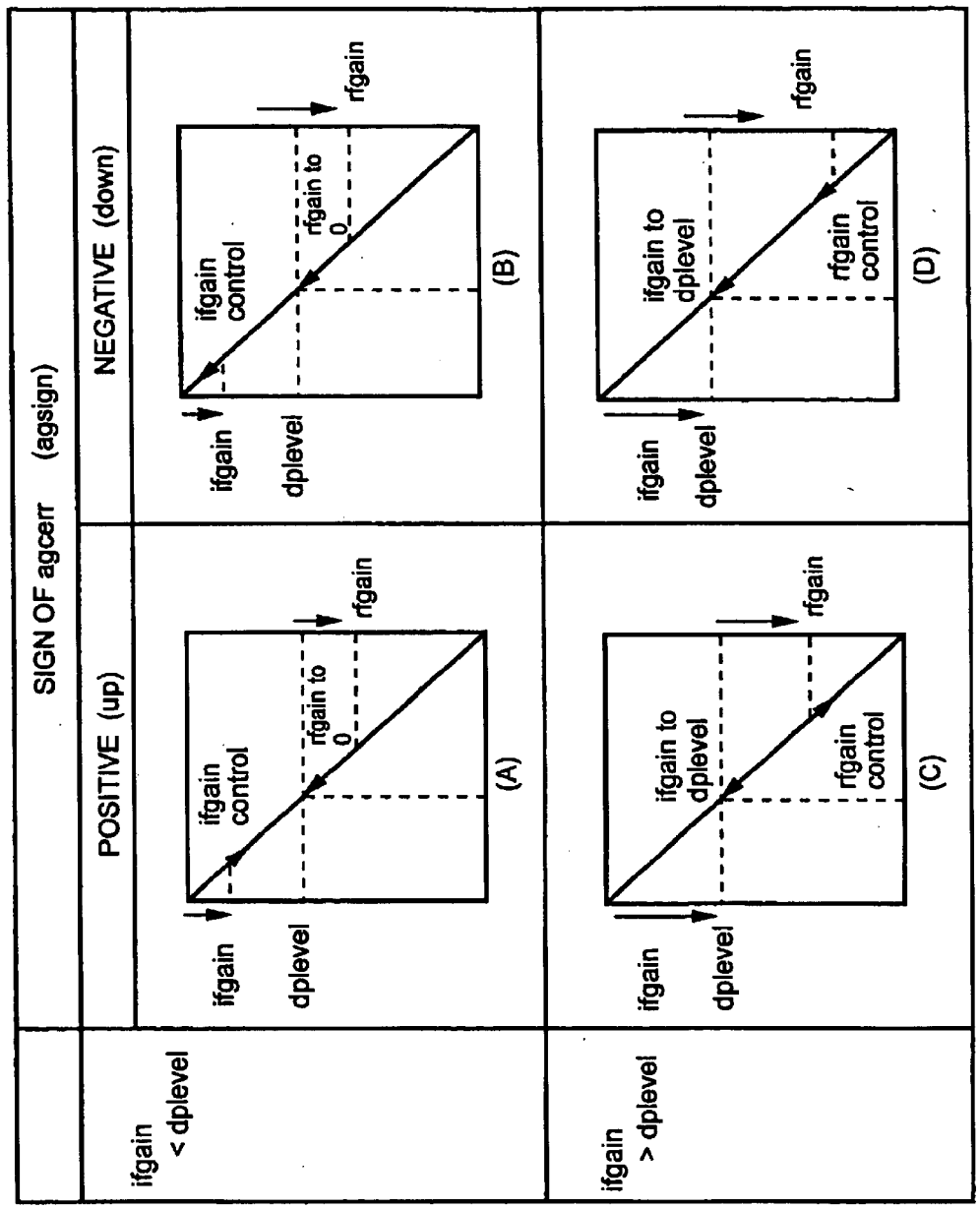
FIG. 10 is a state diagram showing the change of the gain status of the automatic gain control system by the invention.

Next, the operation of the 1st embodiment of the automatic gain control system of the present invention shown in FIG. 1 is explained using FIGS. 2, 9, and 10.

FIG. 2 is a state diagram showing the signal provided to the 1st loop filter 105 and the 2nd loop filter 106, when the signals ifltdp, ifeqdp, agsign, and rfzero are in each status.

In the present invention, the total gain becomes the sum of the gain of RF AGC amplifier and the gain of IF AGC amplifier. Each gain of RF AGC amplifier and IF AGC amplifier is equal 1 or less than 1.

FIG. 9 is a figure in which the input level is taken for the horizontal axis and IF attenuation and RF attenuation along the vertical axis In this invention, how to set up and alter the gain of RF AGC amplifier and the gain of IF AGC amplifier is the problem of how to converge on any position of the linear 91 extended at the lower right from the upper left.

The upper part of horizontal line of the delay point level dplevel is IF active region in which the gain of IF AGC amplifier changes. The down part of horizontal line of the delay, point level dplevel is RF active region in which the gain of RF AGC amplifier changes.

FIG. 10 is a figure for explaining that the status of the receiving apparatus equipped with the gain control system by this invention changes on the straight line 91 in FIG. 9.

FIG. 10A and 10B are the figures showing the status in case the signal ifgain is smaller than the signal dplevel, i.e. when the signal ifltdp is "1" and when the signal ifeqdp is "0" FIG. 10C and 10D are the figures showing the status in case the signal ifgain is smaller than the signal dplevel, i.e. when the signal ifltdp is "1" and when the signal ifeqdp is "0".

In FIG. 1, when the IF AGC control signal 112 is smaller than dplevel, the signal ifltdp is set to "1." When the signal agsign is "0" and the signal rfzero "0" at this time, the output signal agcerr of the signal level detector 614 is provided to the 1st loop filter 105, as shown the first line of FIG. 2.

So, the IF AGC signal 112 provided to the IF AGC amplifier 608 becomes the value which responding to the level of the IF signal, and the automatic gain control is performed.

On the one hand, when the output of the 2nd loop filter 106 is "0", "0" is provided to the 2nd loop filter 106.

When the output of the 2nd loop filter 106 is not "0", as shown in the first line of FIG. 2, the fixed value-rfdump is provided to the 2nd loop filter 106. Finally, it converges in the place where the output of the 2nd loop filter 106 becomes "0."

For this reason, the RF AGC control signal 113 provided to the RF AGC amplifier 602 is set to "0", and the gain of the RF AGC amplifier 602 is fixed to the maximum value.

"0" is provided to the 1st loop filter 105, and the output signal agcerr of the signal level detector 614 is provided to the 2nd loop filter 106, when the IFAGC signal 112 is equal to dplevel and the sign of output agcerr of the signal level detector 614 is not negative, or when the output of the 2nd loop filter 106 is not "0".

At this time, the RF AGC control signal 113 provided to the RF AGC amplifier 602 becomes the value responding to the level of the IF signal, and the automatic gain control is performed.

On the one hand, the IF AGC control signal 112 provided to the IF AGC amplifier 608 is fixed by the signal dplevel, and the gain of IF AGC amplifier is fixed.

"0" is provided to the 2nd loop filter 106, and the output signal agcerr of the signal level detector 614 is provided to the 1st loop filter 105, when the IF AGC signal 112 is equal to dplevel and the sign of the output signal agcerr of the signal level detector 614 is negative, and when the output of the 2nd loop filter 106 is "0".

At this time, the IF AGC control signal 112 provided to the IF AGC amplifier 608 becomes the value responding to the level of the IF signal, and the automatic gain control is performed.

On the one hand, the RF AGC control signal 113 provided to the RF AGC amplifier 602 is fixed by "0", and the gain of RF AGC amplifier is fixed to the maximum value.

The fixed value-ifdump is provided to the 1st loop filter 105, and the output signal agcerr of the signal level detector 614 is provided to the 2nd loop filter 106, when the IF AGC control signal 112 is larger than dplevel and the sign of output agcerr of the signal level detector 614 is not negative, or when the output of the 2nd loop filter 106 is not "0".

At this time, the RF AGC control signal 113 provided to the RF AGC amplifier 602 becomes the value responding to the level of the IF signal, and the automatic gain control is performed.

On the one hand, the IF AGC control signal 112 provided to the IF AGC amplifier 608 is fixed in the place which reduces gradually and was set to signal dplevel, and the gain of IF AGC amplifier is fixed.

"0" is provided to the 2nd loop filter 106 and the output signal agcerr of the signal level detector 614 is provided to the 1st loop filter 105, when the IF AGC signal 112 is larger than dplevel, and the sign of output signal agcerr of the signal level detector 614 is negative and when the output of the 2nd loop filter 106 is "0." At this time, the IF AGC signal 112 provided to the IF AGC amplifier 608 becomes the value responding the level of the IF signal, and the automatic gain control is performed.

On the one hand, the RF AGC signal 113 provided to the RF AGC amplifier 602 is fixed by "0", and the gain of RF AGC amplifier is fixed to the maximum value.

As explained above, the automatic gain control system by the 1st embodiment of this invention shown in FIG. 1 is controlled by IF AGC or RF AGC regardless of the status of the system.

Even if the value of delay point level dplevel is changed, there is no causing the breakdown in the operation of this automatic gain control system.

It is possible to change the delay point level dplevel according to the receiving status, and to adjust the allocation of the gain of the RF AGC amplifier 602 and the gain of the IF AGC amplifier 608.

Therefore, the adjacent disturbance wave exists, even if it is in the status that the RFAGC amplifier 602 is saturated with the conventional gain control, by lowering dplevel, the gain of the RFAGC amplifier 602 can be lowered and the saturation state can be avoided.

The automatic gain control system with few degradations of the performance of the demodulator 611, even when the adjacent disturbance wave of high signal level exists is acquired.

Embodiment 2

Figure 3:
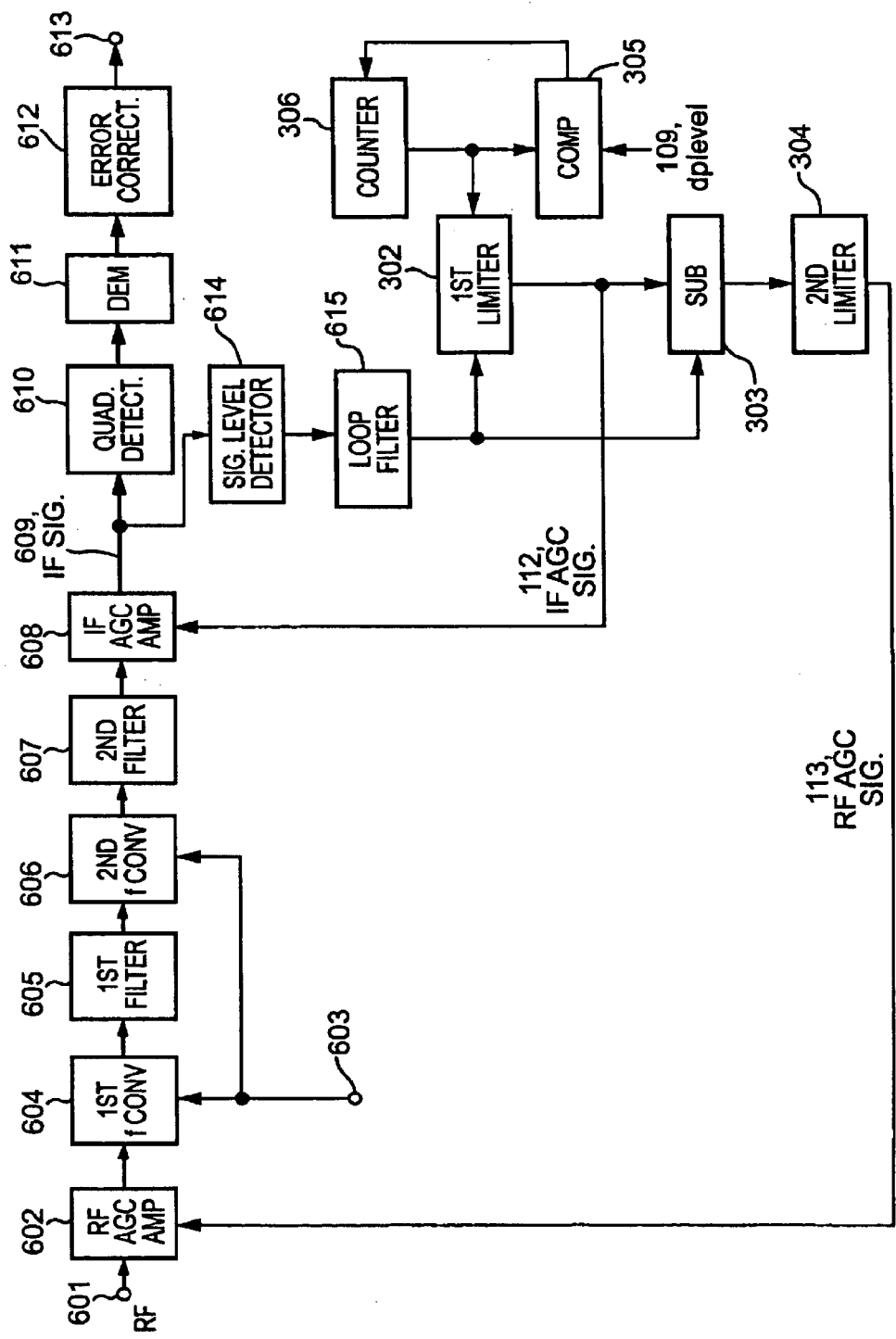
FIG. 3 is a block diagram showing the structure of the 2nd embodiment of the automatic gain control system by the invention.

Next, the 2nd embodiment of the automatic gain control system of this invention is explained using FIG. 3.

FIG. 3 is a block diagram of the 2nd embodiment of the automatic gain control apparatus of the invention.

The structure shown in FIG. 3 adds the 1st limiter 302, the substructor 303, the 2nd limiter 304, the comparator 305, and the counter 306 to the conventional automatic gain control system shown in FIG. 13.

The comparator 617 in FIG. 13 is deleted, and it is altered so that the control signal of the IF AGC amplifier 608 and the control signal of the RF AGC amplifier 602 may be provided from the 1st limiter 302 and the 2nd limiter 304, respectively. Other structures are the same as that of the structure shown in FIG. 13.

The same sign is given to the same part as the 1st embodiment of the automatic gain control system shown in FIG. 1. In FIG. 3, the explanation of the same component as FIG. 1 is abbreviated.

The output signal of the loop filter 615 is provided to one input terminal of the 1st limiter 302 and one input terminal of the substructor 303.

The 1st limiter 302 generates the IFAGC signal 112 which limits amplitude so that it might not become the output of the loop filter 615 larger than the output level of the counter 306. And the IF AGC signal 112 is provided to the input terminal of the IF AGC amplifier 608 and to another input terminal of the substructor 303. The substructor 303 provides the signal which subtracted the output of the 1st limiter 302 from the output of the loop filter 615 to the 2nd limiter 304.

The 2nd limiter 304 provides the RF AGC signal 113 which limits amplitude of the output of the substructor 303 so that it might become more than "0" to the RF AGC amplifier 602.

The comparator 305 compares the delay point level signal dplevel with the output of the counter 306, and provides the control signal which controls the direction of the counter 306 and the enable control signal to the counter 306.

Thus, the counter 306 will become in the count up, the count down, or the idle state, based on the control signal provided from the comparator 305.

Next, the operation of the automatic gain control system of the 2nd embodiment by this invention shown in FIG. 3 is explained.

The comparator 305 provides the control signal which shows whether the count up is carried out when the output of the counter 306 is smaller than the signal dplevel, or the count down is carried out when the output of the counter 306 is larger than the signal dplevel, or the count stop is carried out when the output of the counter 306 is equal to the signal dplevel to the counter 306.

Therefore, when delay point level dplevel varies, the output of the counter 306 approaches dplevel gradually and is fixed in the place set to dplevel.

When the output of the loop filter 615 is smaller than the delay point level dplevel, the IFAGC signal 112 which is the output of the 1st limiter 302 is the same as the output signal of the loop filter 615.

At this time, the IF AGC control signal 112 provided to the IF AGC amplifier 608 becomes the value responding to the signal level of the IF signal, and the automatic gain control is performed.

On the one hand, since the output of the substructor 303 is "0", the RF AGC control signal 113 provided to the RF AGC amplifier 602 is fixed by "0", and the gain of RF AGC amplifier is fixed to the maximum value.

When the output of the loop filter 615 is larger than the delay point level dplevel, the IF AGC signal 112 which is the output of the 1st limiter 302 is the same as the signal dplevel. At this time, the IF AGC signal 112 provided to the IF AGC amplifier 608 is fixed by the signal dplevel, and the gain of IF AGC amplifier is fixed.

On the one hand, the output of the substructor 303 becomes the value which subtracts delay point level dplevel from the output of the loop filter 615. At this time, the RF AGC signal 113 provided to the RF AGC amplifier 602 becomes the value responding to the signal level of the IF signal, and the automatic gain control is performed.

As explained above, the automatic gain control system by the 2nd embodiment of this invention shown in FIG. 3 is controlled by IF AGC or RF AGC regardless of the status of the system.

Even if the value of delay point level dplevel is changed, there is no causing the breakdown in the operation of this automatic gain control system.

Therefore, the automatic gain control system with few degradations of the performance of the demodulator 611, even when the adjacent disturbance wave of high signal level exists is acquired.

Embodiment 3

Figure 4:
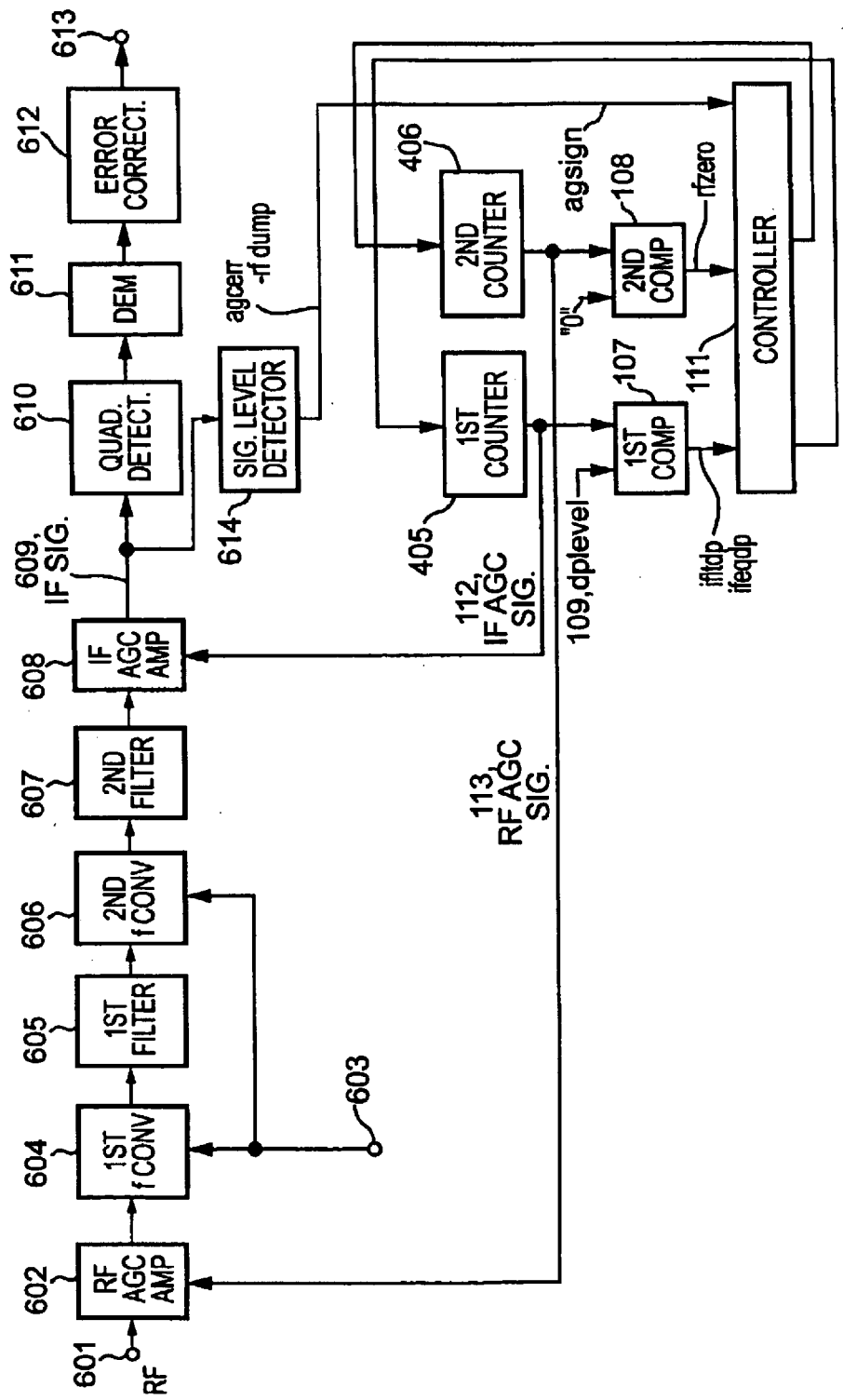
FIG. 4 is a block diagram showing the structure of the 3rd embodiment of the automatic gain control system by the invention.

Next, the automatic gain control system of the 3rd embodiment by this invention is explained using FIG. 4.

FIG. 4 is a block diagram of the 3rd embodiment of the automatic gain control system by this invention.

In the structure shown in FIG. 4, the 1st selector 101 and the 2nd selector 102 in the automatic gain control system which is the 1st embodiment of this invention shown in FIG. 1 are deleted. The 1st loop filter 105 is displaced to the 1st counter 405, and the 2nd loop filter 106 is displaced to the 2nd counter 406.

In FIG. 4, it alters so that the control signal of the controller 111 may be provided to the 1st counter 405 and the 2nd counter 406. Other structures are the same as the structure shown in FIG. 1. The explanation of the same component as FIG. 1 is abbreviated.

Hereafter, the operation of the automatic gain control system of the 3rd embodiment of this invention shown in FIG. 4 is explained using FIG. 5.

FIG. 5 is a state diagram showing the operation of the 1st counter 405 and the 2nd counter 406, when the signals ifltdp, ifeqdp, agsign, and rfzero are in each status.

When the IF AGC control signal 112 is smaller than the delay point level dplevel, the 1st counter 405 carry out the count up or the count down, responding to the polarity of output signal agcerr of the signal level detector 614.

For this reason, the IF AGC control signal 112 provided to the IF AGC amplifier 608 becomes the value responding to the signal level of the IF signal, and the automatic gain control is performed.

On the one hand, when the output of the 2nd counter 406 is "0", it is fixed to "0", and when the output of the 2nd counter 406 is not "0", the count down of the 2nd counter 406 is carried out, and it is converged in the place where the output of the 2nd counter 406 became "0."

For this reason, the RFAGC signal 113 provided to the RF AGC amplifier 602 is set to "0", and the gain of the RF AGC amplifier 602 is fixed to the maximum value.

When the IF AGC signal 112 is equal to the delay point level dplevel and the sign of the output signal agcerr of the signal level detector 614 is not negative, or when the output of the 2nd counter 406 is not "0", the 1st counter 405 is fixed to the delay point level dplevel.

Responding to the sign of output signal agcerr of the signal level detector 614, the 2nd counter 406 carries out the count up or the count down.

At this time, the RF AGC signal 113 provided to the RF AGC amplifier 602 becomes the value responding to the level of the IF signal, and the automatic gain control is performed.

On the one hand, the IF AGC signal 112 provided to the IF AGC amplifier 608 is fixed by the delay point level dplevel, and the gain of IF AGC amplifier is fixed.

When the IF AGC signal 112 is equal to the delay point level dplevel, and the sign of output signal agcerr of the signal level detector 614 is negative and when the output of the 2nd counter 406 is "0", the 2nd counter 406 is fixed to "0."

According to the sign of output signal agcerr of the signal level detector 614, the count down of the 1st counter 405 is carried out. At this time, the IF AGC signal 112 provided to the IF AGC amplifier 608 becomes the value responding to the level of the IF signal, and the automatic gain control is performed.

On the one hand, the RF AGC signal 113 provided to the RF AGC amplifier 602 is fixed by "0", and the gain of the RF AGC amplifier 602 is fixed to the maximum value.

When the IF AGC signal 112 is larger than the delay point level dplevel and the sign of output signal agcerr of the signal level detector 614 is not negative, or when the output of the 2nd counter 406 is not "0", the count down of the 1st counter 405 is carried out.

Responding to the sign of output signal agcerr of the signal level detector 614, the count up or the count down of the 2nd counter 406 is carried out. At this time, the RF AGC signal 113 provided to the RF AGC amplifier 602 becomes the value responding to the level of the IF signal, and the automatic gain control is performed.

On the other hand, the IF AGC signal 112 provided to the IF AGC amplifier 608 reduces gradually, and is fixed in the place set to the delay point level dplevel, and the gain of the IF AGC amplifier 608 is fixed. When the IFAGC signal 112 is larger than the delay point level dplevel, and the sign of output signal agcerr of the signal level detector 614 is negative and when the output of the 2nd counter 406 is "0", the 2nd counter 406 is fixed to "0."

According to the sign of output agcerr of the signal level detector 614, the count down of the 1st counter 405 is carried out. At this time, the IF AGC signal 112 provided to the IF AGC amplifier 608 becomes the value responding to the level of the IF signal, and the automatic gain control is performed.

On the one hand, the RF AGC signal 113 provided to the RF AGC amplifier 602 is fixed by "0", and the gain of the RF AGC amplifier 602 is fixed to the maximum value.

As explained above, as for the automatic gain control system of the form of the 3rd operation of this invention shown in FIG. 4, the automatic gain control of IF or the automatic gain control of RF is always performed regardless the status. Therefore, even if the value of the delay point level dplevel is changed, there is no causing the breakdown in the operation of the automatic gain control system.

Therefore, as stated above, even when the adjacent disturbance wave of high signal level exists, the automatic gain control system with few degradations of the performance of the demodulator 611 is acquired.

Thus, according to this invention, even if the delay point level dplevel is changed, the automatic gain control system which can perform AGC operation normally can be organized.

Next, how to set delay point level dplevel is explained. As mentioned above, about noise characteristics, it is so advantageous that the set point of delay point level dplevel is made high and the RF AGC amplifier 602 makes high signal level which performs the automatic gain control.

However, when the high adjacent disturbance wave of signal level exists, the remarkable degradation of the performance is caused.

Therefore, by lowering the value of predetermined value dplevel, only when the adjacent disturbance wave exists, the automatic gain control system by which the performance does not degrade even when the adjacent disturbance wave exists, maintaining low noise characteristics is acquired.

The existence of the adjacent disturbance wave can be confirmed by supervising the recovery status, that is, although the received wave can be normally demodulated when the adjacent disturbance wave does not exist, when the adjacent disturbance wave exists, the received wave cannot be demodulated normally.

So, the existence of the adjacent disturbance wave can be indirectly presumed by supervising the recovery status. As the recovery status to supervise, for example, the detection of error rate is considered.

When the adjacent disturbance wave exists, the error rate of the demodulated signal aggravates compared with the case where it does not exist. The affection of the adjacent disturbance wave can be pressed down to the minimum extent by setting up the delay point level dplevel so that the error rate may become the lowest.

Embodiment 4

In the above all embodiments, the delay point level can be changed, but not automatically. However, in the present invention, the delay point revel can be automatically changed so that the error rate may be detected and this may become small.

Below, embodiments of this invention in which the delay point level can be changed automatically are explained.

Figure 6:
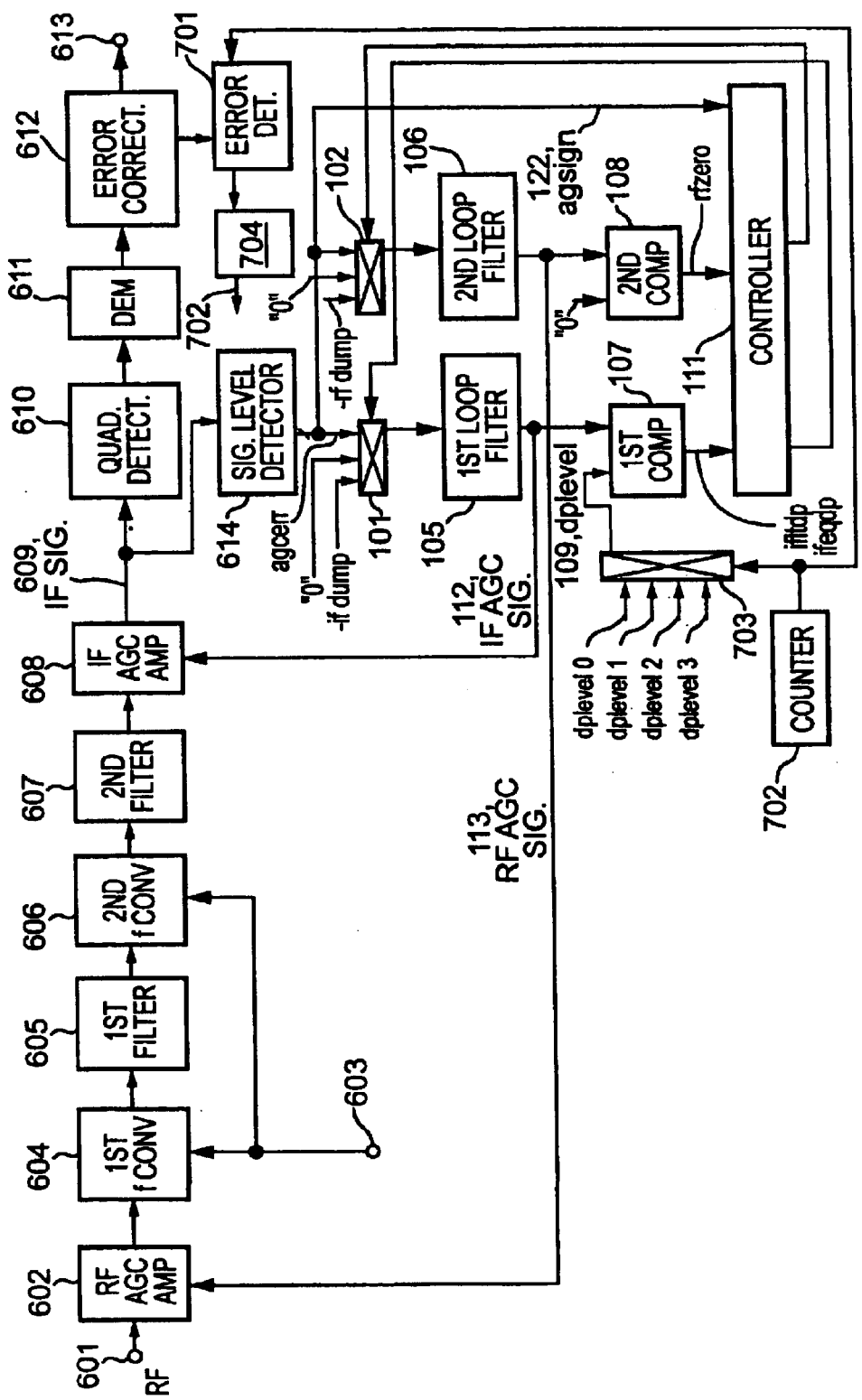
FIG. 6 is a block diagram showing the structure of the 4th embodiment of the automatic gain control system by the invention.

The 4th embodiment of the automatic gain control system of this invention is explained using FIG. 6. FIG. 6 is a block diagram of the 4th embodiment of the automatic gain control system of the invention.

The structure shown in FIG. 6 adds the error rate detector 701, the counter 702, the selector 703, and the decision circuit 704 to the 1st embodiment of the automatic gain control system of the invention shown in FIG. 1. The recovery status is detected by this structure. Other structure is the same as the structure shown in FIG. 1. The explanation abbreviates about the same components as the structure shown in FIG. 1.

The counter 702 provides the status signal which shows the status from 0 to 3, to the selector 703 and the error rate detector 701 at the predetermined time interval.

The error rate detector 701 detects the error rate using the signal provided from the error corrector 612, and it maintains for every status showing the status signal provided from the counter 702.

The selector 703 provides each fixed value of dplevel 0, dplevel 1, dplevel 2 and dplevel 3 from which level respectively differs for every status, which shows the status signal provided from the counter 702 to the 1st comparator 107 as the delay point level dplevel 109.

Next, the operation of the 4th embodiment of this invention shown in FIG. 6 is explained.

According to the status 0, 1, 2, and 3 that the counter 702 shows, the fixed value of each level of dplevel 0, dplevel 1, dplevel 2, and dplevel 3 is provided to the delay point level dplevel 109 provided to one input terminal of the 1st comparator 107 one by one. At the time, the error rate in each status is maintained at the error rate detector 701.

Then, when the counter 702 takes a round, the decision circuit 704 decides the status that the error rate is the lowest, among the status 0, 1, 2, and 3, and the status that the error rate is the lowest is maintained by setting it as the counter 702.

As explained above, also in the status that there is a adjacent disturbance wave of high level, by lowering the delay point level dplevel automatically, it is stabilized and the demodulation can be performed at the 4th embodiment of the automatic gain control system of this invention shown in FIG. 6.

As a supervision means of the recovery status, the error rate is not the only thing. In the digital demodulating equipment, as above-mentioned, the recovery result is compared with the predetermined symbol level, and the nearest symbol level is decided as a playback symbol value.

However, when the adjacent disturbance wave of high level exists, the error of the recovery result and predetermined symbol level increases.

Therefore, the affection of the adjacent disturbance wave can be easily decided by taking the dispersion of this error.

Embodiment 5

Figure 7:
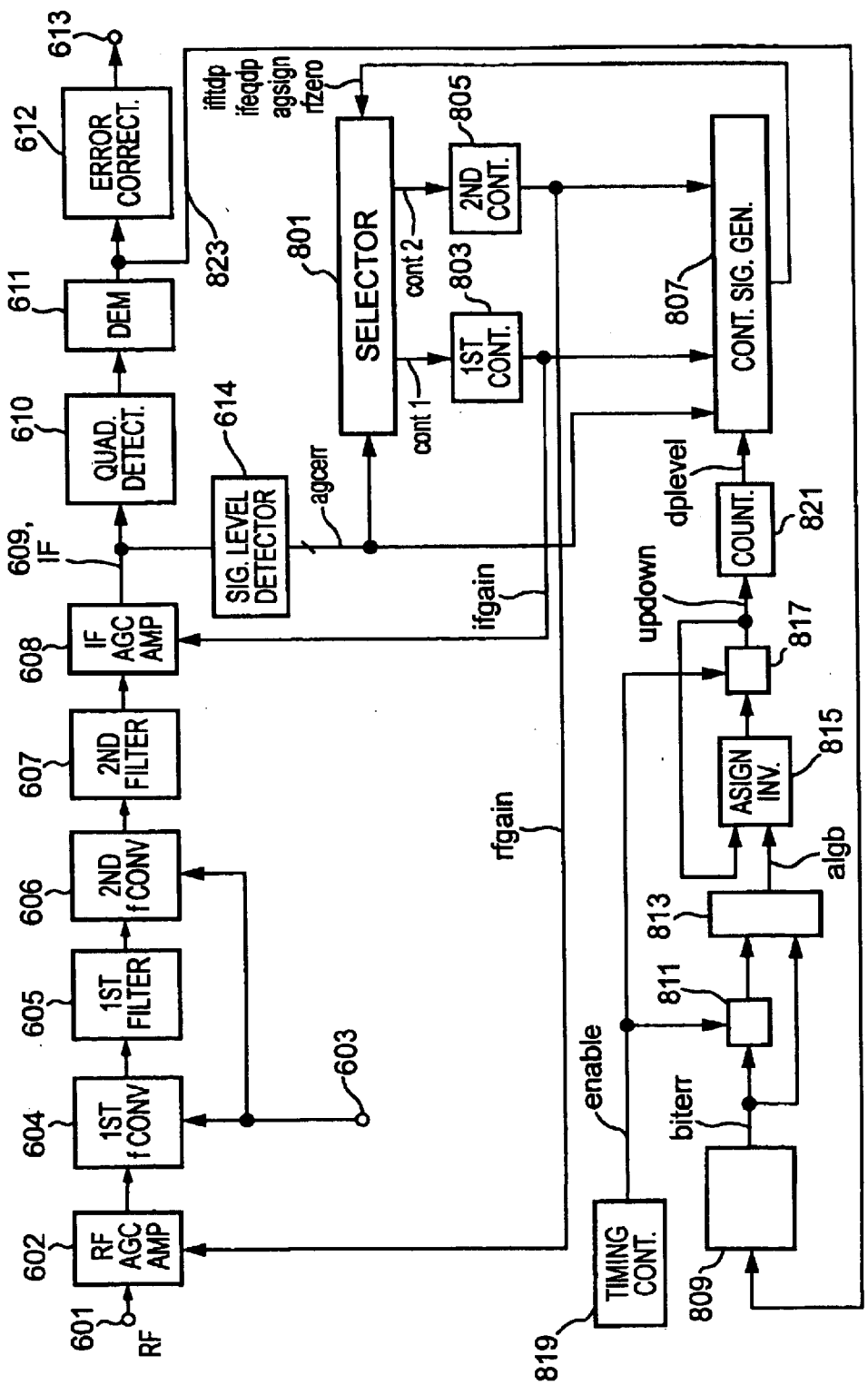
FIG. 7 is a block diagram showing the structure of the 5th embodiment of the automatic gain control system by the invention.

Next, the 5th embodiment of the invention is explained using FIG. 7. FIG. 7 shows the structure of the 5th embodiment of the automatic gain control apparatus by the invention.

The structure shown in FIG. 7 adds the selector 801, the 1st controller 803, the 2nd controller 805, the control signal generator 807, the condition monitor 809, the 1st latch 811, the comparator 813, the sign inverter 815, the 2nd latch 817, the timing controller 819, and the counter 821 to the conventional automatic gain control system shown in FIG. 13.

It alters so that the loop filter 615 and the comparator 617 in FIG. 13 may be deleted, the control signal of the IF AGC amplifier 608 may be provided from the 1st controller 803 and the control signal of the RF AGC amplifier 602 may be provided from the 2nd controller 805. Other structures are the same as that of the structure shown in FIG. 13. The explanation of the same component as the component in FIG. 13 abbreviates.

The output of the signal level detector 614 is provided to the 1st input terminal of the selector 801, and the 1st input terminal of the control signal generator 807.

According to the table shown in FIG. 8, the selector 801 provides the 1st output cont1 to the 1st controller 803, and provides the 2nd output cont2 to the 2nd controller 805.

In FIG. 2, value-ifdump and value-rfdump imply the predetermined value.

The 1st controller 803 integrates the 1st output signal cont1 of the selector 801, and provides the output signal ifgain to the IF AGC amplifier 608 and the 2nd input terminal of the control signal generator 807.

The 2nd controller 805 integrates the 2nd output signal cont2 of the selector 801, and provides the output signal rfgain to the RF AGC amplifier 602 and the 3rd input terminal of the control signal generator 807.

The timing controller 819 provides the enable signal which shows the timing of the predetermined period to the 1st latch 811 and the 2nd latch 817.

The output 823 of the demodulator 611 is inputted into the status monitor 809, and it provides the bit error signal biterr which shows the recovery status to the 1st the latch 811 and the 1st input terminal A of the comparator 813. The bit error signal biterr becomes the bigger value when the recovery status is worse.

The 1st latch 811 maintains the output of the status monitor 809 at the timing of the enable signal, and provides it to the 2nd input terminal B of the comparator 813.

The comparator 813 is outputted to signal algb which becomes "1" when the signal level of 1st input terminal A exceeds the input level of 2nd input terminal B, and becomes "0" when the signal level of 1st input terminal A is smaller than the input level of 2nd input terminal B, to the sign inverter 815.

When the signal algb is "0", the sign inverter 815 provides the output of the 2nd latch 817 to the 2nd latch 817. When the signal algb is "1", the inversion signal of the output of the 2nd latch 817 is provided to the 2nd latch 817.

The 2nd latch 817 maintains the output of the sign inverter 815 at the timing of enable signal, and provides the signal updown to the counter 821.

When the signal updown is "0", the counter 821 integrates the signal in the negative direction. When the signal updown is "1", the counter 821 integrates the signal in the positive direction. The counter 821 provides the delay point level dplevel to the control signal generator 807.

From the signal agcerr provided from the signal level detector 614, the signal ifgain provided from the 1st controller 803, the signal rfgain provided from the 2nd controller 805, and the delay point level dplevel provided from the counter 821, the control signal generator 807 generates the signals ifltdp, ifeqdp, agsign, and rfzero shown by the following formulas, and provides them to the selector 801.

Ifltdp=(ifgain<dplevel)
ifeqdp=(ifgain==dplevel)
agsign=(agcerr<0)
rfzero=(rfgain==0)

The automatic gain control operation of the 5th embodiment of this invention shown in FIG. 7 is explained using FIG. 9. FIG. 9 is a state diagram showing the relation of the input level of the IF signal and the gain. The horizontal axis expresses the input level and the vertical axis expresses the signal ifgain and the signal rfgain.

In FIG. 9, the values becomes large so that signal ifgain and signal rfgain go downward. That is, each gain of the IF AGC amplifier 608 and the RF AGC amplifier 602 becomes small, respectively.

In the vertical axis, the area above delay point level dplevel shows the status that the signal ifgain is below the delay point level dplevel.

Since the signal agcerr is outputted as the signal cont1 from the selector 801 at this time as shown in FIG. 7, the 1st controller 803 integrates the signal agcerr, and the automatic gain control by the IF. AGC amplifier 608 is performed. On the other hand, as the signal cont 2, "0" or the signal-rfdump is outputted from the selector 801.

For this reason, the gain of the RF AGC amplifier 602 is converged on 0, i.e., the maximum gain. That is, the area above the delay point level dplevel shows the area where the automatic gain control by the IF AGC amplifier 608 is performed.

When the signal ifgain is equal to the delay point level dplevel, as shown in FIG. 8, the signal agcerr is outputted as the signal cont 2. The 2nd controller 805 integrates the signal agcerr and the automatic gain control by the RF AGC amplifier 602 is performed. On the one hand, "0" is outputted as a signal cont 1.

For this reason, the gain of the IF AGC amplifier 608 is fixed to the delay point level dplevel, i.e., the minimum gain.

On the vertical axis, the area below the delay point level dplevel shows the status that the signal ifgain is larger than the delay point level dplevel.

As shown in FIG. 8, since the signal agcerr is outputted as the signal cont 2, the 2nd controller 805 integrates the signal agcerr and the automatic gain control by the RF AGC amplifier 602 is performed. The signal-ifdump is outputted as the signal cont 1.

For this reason, the gain of the IF AGC amplifier 608 is converged on the delay point level dplevel, i.e., the minimum gain. That is, the area below dplevel shows the area where the automatic gain control by the RF AGC amplifier 602 is performed.

However, when agsign=1 and rfzero=1, i.e., when the signal rfgain is "0" and the direction of the gain control is negative, the signal agcerr is outputted as cont 1, and "0" is outputted as a signal cont 2, and the automatic gain control by the IF AGC amplifier 608 is performed.

This implies the transition to the area above the delay point level dplevel from the area below the delay point level dplevel.

Next, the relationship of the signals ifgain, rfgain, dplevel, and agcerr and the automatic gain control is explained in detail using FIG. 10. In FIG. 10, the relation of the signal ifgain and the delay point level dplevel is taken perpendicularly, and the sign of the signal agcerr is taken horizontally.

FIG. 10 is a figure showing how the automatic gain control is performed in each status. FIG. 10A expresses the status of ifltdp=1 and agsign=0. FIG. 10B expresses the status of ifltdp=1 and agsign=1. FIG. 10C expresses the status of ifltdp=0 and agsign=0. FIG. 10D expresses the status of ifltdp=0 and agsign=1.

In the area above the delay point level dplevel, the automatic gain control by the IF AGC amplifier 608 is performed, and the gain of the RF AGC amplifier 602 is maintained at the maximum value as clearly from FIG. 10.

In the area below the delay point level dplevel, the automatic gain control by the RF AGC amplifier 602 is performed, and the gain of the IF AGC amplifier 608 is maintained at the delay point level dplevel.

That is, according to the value of the delay point level dplevel, the area of the automatic gain control by the IF AGC amplifier 608 and the area of the automatic gain control by the RF AGC amplifier 602 are controllable.

Next, the operation of the delay point level control in the 5th embodiment of this invention shown in FIG. 7 is explained using FIG. 11. FIG. 11 shows the status when delay point level dplevel varies from dp1 to dp2 smaller than dp1 i.e., the signal updown is equal to "0".

When the delay point level dplevel was dp1, the value of bit error signal biterr became L1, and when the delay point level dplevel was dp2, the value of bit error signal biterr became L2 smaller than L1.

In this case, it implies that the recovery status became better and signal algb is set to 0. Therefore, the signal updown becomes 0 and the delay point level of the following timing becomes dp3 smaller than dp2.

When the delay point level dplevel was dp1, the value of the bit error signal biterr became L1, and when delay point level dplevel was dp2, the value of the bit error signal biterr became L2a larger than L1.

In this case, it implies that the recovery status became worse and signal algb is set to 1. Therefore, the signal updown becomes 1 in this case, and the delay point level dplevel returns to dp1 at the following timing.

Thus, when the recovery status becomes good by the change of the delay point level dplevel, the control direction do not change, but when the recovery status becomes bad by the change of the delay point level dplevel, the control direction changes.

Next, the relation of delay point level dplevel and the recovery status is explained in detail using FIG. 12. FIG. 12 is a state diagram showing the relation of delay point level dplevel and bit error signal biterr in case where there is no disturbance wave 12A, and in case where there is a disturbance wave 12B.

FIG. 12 shows the state diagram at the time of setting the delay point level dplevel into the maximum value, and setting the signal updown to "0" as an initial state.

In case of no disturbance wave, the bit error signal biterr becomes small so that the delay point level is so small i.e., the gain of the RF AGC amplifier 602 is so large, as shown in FIG. 12A. Therefore, the status curve serves as left going down.

At this time, signal updown is always becomes 0 and the delay point level dplevel reduces in monotone. Therefore, the gain of the RF AGC amplifier 602 is converged on the maximum value, and the value of the bit error signal biterr becomes the minimum.

On the other hand, when there is a disturbance wave, that the delay point level is small does not necessarily imply that the bit error signal biterr is small. When the gain of the RF AGC amplifier 602 is large, the RF AGC amplifier 602 may become the saturation state. Therefore, the status curve become a concave shape depressed on the way.

In this case, the signal updown becomes "1" at the hollow point, and the delay point level dplevel is changed to the increment.

At the following timing, the signal updown becomes "0" and the delay point level dplevel is changed to the decrement. The converging point turns into the hollow point and the value of bit error signal biterr becomes the minimum.

FIG. 12 explained the case where the delay point level dplevel was set into the maximum value, and the signal updown was set to "0" as an initial state.

In this invention, it is not necessarily especially limited to such a status.

As it became clear by the above explanation, even if it starts from which status, according to this invention, it always converges on the delay point level dplevel in which bit error signal biterr becomes minimum value. However, when the initial state is set as the above-mentioned value, there is an advantage shown especially in the following.

As mentioned above, if the gain of the RF AGC amplifier 602 is too high when the disturbance wave of high signal level is in the adjacent channel, it will become the saturation state and the distortion will be caused in the received signal.

Therefore, the recovery operation can be more certainly performed by setting up delay point level dplevel sufficiently large so that it may become sufficient low gain from which the RFAGC amplifier 602 will not become in the saturation state as an initial state.

As explained above, also in the status that there is a adjacent disturbance wave of high level, by lowering the delay point level dplevel automatically, the 5th embodiment of this invention shown in FIG. 7 can perform the demodulation stably.

Moreover, especially as a recovery method, when Orthogonal Frequency Division Multiplexing (OFDM) is used, the existence of the adjacent disturbance wave can be judged also under supervising the output of Fast Fourier Transform (FFT).

In the case of the OFDM demodulation, FFT is applied and the input signal is decomposed into each frequency component. At this time, the part actually modulated is a part for the core of the frequency, and the outside component is not modulated.

That is, originally the outside frequency component does not exist. However, when the adjacent disturbance wave exists, the disturbance component is leaked in the frequency component in which the signal originally does not exist. Therefore, the existence of the disturbance wave is detectable by supervising this component.

Although explained above as an automatic gain control system of the digital demodulating equipment using the orthogonal carrier, the invention is not limited to that and can be applied to the various demodulating equipment other than that.

For example, when making it apply to the demodulating equipment of the single carrier modulation like Vestigial Side Band (VSB), the orthogonal wave detector 610 is unnecessary and performs the demodulation of VSB by the demodulator 611.

And the affection of the adjacent disturbance wave is judged with the supervision means of the recovery status, for example, the status monitor 809, by taking the dispersion of the error between the input signal level and predetermined level.

As explained above, the saturation state of the amplifier which causes the remarkable degradation with the performance of the demodulator 611 can be avoided, even when the adjacent disturbance wave of high level exists, by controlling the circuit which controls the gain of the IF AGC amplifier 608, and the circuit which controls the gain of the RF AGC amplifier 602, according to predetermined value, by this invention.

Therefore, according to the automatic gain control method and the system by the present invention, on a scale of the few circuit, it has low noise characteristics and high adjacent disturbance oppression characteristics, and there is no need for the tuning.

Obviously, many, modifications and variations of this invention are possible in the light of the above teachings. It is therefore to be understood that within the scope of the appended claims, this invention may be practiced otherwise than as specifically described.

What is claimed is:

1. An automatic gain control system comprising:
   first amplifying means for amplifying an intermediate frequency signal;
   second amplifying means for amplifying an radio frequency signal received;
   signal level detecting means for detecting difference between a level of output signal of the first amplifying means and a predetermined level;
   first controlling means for controlling a gain of the first amplifying means;
   second controlling means for controlling a gain of the second amplifying means; and
   third controlling means for changing operation of the first controlling means and the second controlling means according to a first predetermined value and an output of the signal level detecting means, wherein the third controlling means comprises:
   counting means for reaching the first predetermined value successively;
   limiting means for an output of the signal level detecting means by an output level of the counting means; and,
   subtracting means for subtracting an output of the limiting means from an output of the signal level detecting means.

2. An automatic gain control system comprising:
   first amplifying means for amplifying an intermediate frequency signal;
   second amplifying means for amplifying an radio frequency signal received;
   signal level detecting means for detecting difference between a level of output signal of the first amplifying means and a predetermined level;
   first controlling means for controlling a gain of the first amplifying means;
   second controlling means for controlling a gain of the second amplifying means; and
   third controlling means for changing operation of the first controlling means and the second controlling means according to a first predetermined value and an output of the signal level detecting means, wherein the third controlling means comprises:
   first counting means for increasing or decreasing according to a sign of output of the signal level detecting means;
   first comparing means for comparing an output of the first counting means; and,
   second counting means for increasing or decreasing according to an output of the first comparing means and a sign of output of the signal level detecting means.

3. An automatic gain control system comprising:
   first amplifying means for amplifying an intermediate frequency signal;
   second amplifying means for amplifying an radio frequency signal received;
   signal level detecting means for detecting difference between a level of output signal of the first amplifying means and a predetermined level;
   first controlling means for controlling a gain of the first amplifying means;
   second controlling means for controlling a gain of the second amplifying means;
   third controlling means for changing operation of the first controlling means and the second controlling means according to a first predetermined value and an output of the signal level detecting means wherein the third controlling means comprises:
   first switching means for switching an input signal of the first controlling means;
   second switching means for switching an input signal of the second controlling means; and,
   a comparator for comparing an output level of the first controlling means with the first predetermined value, and
   wherein the first switching means outputs an output of the signal level detecting means when an output level of the first controlling means is smaller than the first predetermined value, and outputs a second predetermined value when the output level of the first controlling means is larger than the first predetermined value, to the first controlling means; and, wherein the second switching means outputs a third predetermined value when an output level of the first controlling means is smaller than the first predetermined value, and outputs an output of the signal level detecting means when the output level of the first controlling means is larger than the first predetermined value, to the second controlling means.

4. Automatic gain control system comprising:

first amplifying means for amplifying an radio frequency signal received;

second amplifying means for amplifying an intermediate frequency signal converted from the radio frequency signal amplified;

first controlling means for controlling a gain of the first amplifying means;

second controlling means for controlling a gain of the second amplifying means;

status monitoring means for monitoring recovery status;

maintaining means for maintaining an output of the status monitoring means;

comparing means for comparing an output of the status monitoring means with an output of the maintaining means;

counting means for changing a direction of controlling according to an output of the comparing means;

control signal generating means for controlling operation of the first controlling means and the second controlling means according to an output of the counting means.

5. Automatic gain control system as in claim 4, wherein the counting means is initialized to a gain at which the first amplifying means is not saturated.

6. Automatic gain control system as in claim 4, wherein the counting means is initialized to decreasing direction of a gain of the first amplifying means.

* * * * *